United States Patent
Sajan et al.

(10) Patent No.: US 6,248,484 B1
(45) Date of Patent: Jun. 19, 2001

(54) HYBRID ALIGNMENT MARKS FOR OPTIMAL ALIGNMENT OF THREE-DIMENSIONAL LAYERS

(75) Inventors: Marokkey Raphael Sajan; Alex (Tsun-Lung) Cheng, both of Singapore (SG)

(73) Assignee: Chartered Semiconductor Manufacturing Ltd., Singapore (SG)

( * ) Notice: Subject to any disclaimer, the term of this patent is extended or adjusted under 35 U.S.C. 154(b) by 0 days.

(21) Appl. No.: 09/344,401

(22) Filed: Jun. 25, 1999

(51) Int. Cl.[7] .................................................. G03F 9/00
(52) U.S. Cl. .......................... 430/22; 430/311; 430/313; 430/314; 430/315; 438/401
(58) Field of Search .............................. 430/22, 311, 313, 430/314, 315; 438/401

(56) References Cited

U.S. PATENT DOCUMENTS

| | | | |
|---|---|---|---|
| 4,962,318 | 10/1990 | Nishi | 250/548 |
| 5,401,691 | 3/1995 | Caldwell | 437/228 |
| 5,705,320 | 1/1998 | Hsu et al. | 430/313 |
| 5,783,340 | 7/1998 | Farino et al. | 430/22 |
| 5,808,910 | 9/1998 | Irie et al. | 364/559 |

Primary Examiner—Christopher G. Young
(74) Attorney, Agent, or Firm—George O. Saile; Rosemary L. S. Pike

(57) ABSTRACT

Hybrid alignment markings with a plurality of parallel marks on an active area of a silicon layer on which a multilayer structure are formed by forming initial marks in the active area by modifying the profile of the active area producing an active area surface of the active area with initial marks and then forming on the active area surface a set of interleaved marks from a second, polysilicon layer to form a single composite alignment marking composed of the initial marks and the interleaved marks. One technique is to form shallow steps with shallow trenches with low mesas in the silicon layer followed by forming low ribs of the second, polysilicon layer on the low mesas adjacent interleaved with the shallow trenches. Alternatively, form shallow cavities with low ribs in the silicon layer forming exposed low cavity surfaces of the silicon layer, and then form additional low ribs of a polysilicon layer in the shallow cavities on the exposed low cavity surfaces of the silicon layer.

16 Claims, 5 Drawing Sheets

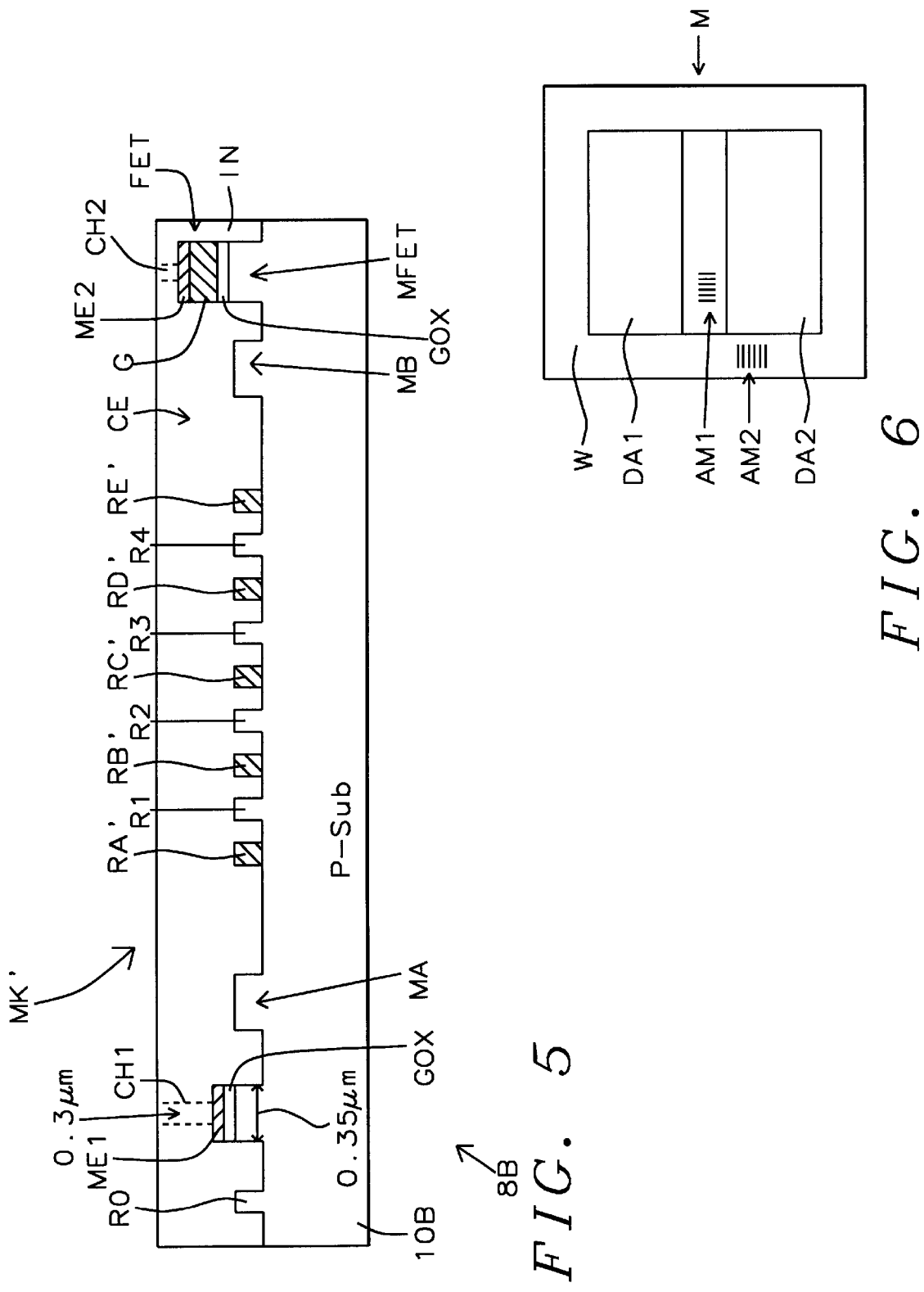

HYBRID ALIGNMENT MARKS FOR OPTIMAL ALIGNMENT OF THREE-DIMENSIONAL LAYERS

BACKGROUND OF THE INVENTION

1. Field of the Invention

This invention relates to alignment systems for manufacturing and more particularly to alignment marks employed on parts to be aligned.

2. Description of Related Art

The present invention relates to structures such as semiconductor devices with combination of an active region such as a silicon layer or a silicon substrate. On the silicon layer or substrate there are contact layers and polysilicon layers. During front end processing steps, usually both the polysilicon layers and contact layers are aligned to the active layer; and in such a case, there is a possibility for misalignment between the contact layer and the polysilicon layer. Many circuit designs, demand good alignment of the contact layers with both the active layer and the polysilicon layers. A nine (9) mark Field Image Alignment (FIA) marking system is employed in a system manufactured by Nikon Corporation in which alignment markings are provided on a work piece.

U.S. Pat. No. 4,962,318 of Nishi for "Alignment System for Exposure Apparatus", assigned to Nikon Corporation describes Field Image Alignment (FIA) markings at Col. 6, line 59 to Col. 7, line 61 and in FIG. 1A thereof. Light from a halogen lamp is directed onto an alignment mark. At Col. 10, line 15 to Col. 11, line 11, such an alignment marking is described as a pattern of stripes raised from the surface of a wafer covered with photoresist.

U.S. Pat. No. 5,808,910 of Irie et al., "Alignment Method" assigned to Nikon Corporation describes a Field Image Alignment (FIA) marking system at Col. 8, line 34 to Col. 9, line 7 and in FIG. 2 thereof.

U.S. Pat. No. 5,783,340 of Farino et al. "Method for Photolithographic Definition of Recessed Features on a Semiconductor Wafer Utilizing Auto-Focusing Alignment" discloses a method for forming an alignment marking formed a several marks in a trench for a stepper.

U.S. Pat. No. 5,401,691 of Caldwell "Method of Fabrication an Inverse Open Frame Alignment Mark" teaches a method of forming alignment marks.

U.S. Pat. No. 5,705,320 of Hsu et al. for "Recovery of Alignment Marks and Laser Marks after Chemical-Mechanical-Polishing" shows method steps for forming topographic alignment marks (topographical features or steps formed in a substrate) located in a window.

SUMMARY OF THE INVENTION

This invention provides a methods for combining a set of active area marks and an interleaved set of polysilicon marks to form a single composite alignment marking.

The invention teaches a method for making a hybrid alignment marking for optimal alignment of three (3) layers comprising:

(a) forming integral alignment marks in a lower layer from the material of the lower layer, (b) forming alignment ribs on a surface of the lower layer interleaved with the integral alignment marks.

Alternatively this invention provides a method for making a hybrid alignment marking for optimal alignment of three (3) layers comprising:

(1) Forming CD alignment marks by as follows:
  (a) forming shallow steps with shallow trenches with low mesas in silicon material,
  (b) forming low polysilicon ribs on the low mesas adjacent interleaved with the shallow trenches, or (2) Forming CD alignment marks as follows:
  (a) forming shallow cavities with low ribs in silicon material exposing low cavity surfaces of the silicon material, and
  (b) forming low polysilicon ribs in the shallow cavities on the exposed low cavity surfaces surfaces of the silicon material.

In accordance with this invention, a method is provided for forming hybrid alignment markings with a plurality of parallel marks on an active area of a silicon layer on which a multilayer structure are formed by forming initial marks in the active area by modifying the profile of the active area producing an active area surface of the active area with initial marks and then forming on the active area surface a set of interleaved marks from a second, polysilicon layer to form a single composite alignment marking composed of the initial marks and the interleaved marks. One technique is to form shallow steps with shallow trenches with low mesas in the silicon layer followed by forming low ribs of the second, polysilicon layer on the low mesas adjacent interleaved with the shallow trenches. Alternatively, form shallow cavities with low ribs in the silicon layer forming exposed low cavity surfaces of the silicon layer, and then form additional low ribs of a polysilicon layer in the shallow cavities on the exposed low cavity surfaces of the silicon layer.

In another aspect of this invention, the hybrid markings resulting from the process are provided on a workpiece.

BRIEF DESCRIPTION OF THE DRAWINGS

The foregoing and other aspects and advantages of this invention are explained and described below with reference to the accompanying drawings, in which:

FIG. 5 shows a sectional view of a larger portion of the device of FIG. 4B with the adjacent structure included laterally of the alignment marking after coating of the device with dielectric insulator.

FIG. 6 shows a workpiece in the form of a semiconductor wafer is shown with device areas thereon and with a set of hybrid alignment marks in accordance with this invention, the marks being oriented orthogonally, i.e. vertically and horizontally respectively.

DESCRIPTION OF THE PREFERRED EMBODIMENT

Consider a method of manufacturing semiconductor devices employing alignment procedures, as follows:

1. In the case of multilayer semiconductor devices, contact alignment to both a polysilicon layer and an active layer are critical in different directions, say alignment is critical in the X-direction for polysilicon and alignment is critical in Y-direction for the active layer, so a contact X is aligned to the polysilicon layer and a contact Y is aligned to the active layer.
2. With respect to both polysilicon and active layers, use is made of multiple alignment marks, i.e. alignment to both an X marks and a Y mark, to achieve an average alignment performance.

Problems identified by the inventors with the above alignment practices are as follows:

1. Job files have to be maintained depending on the directional sensitivity.
2. In cases in which the alignment is critical in both the X direction and the Y direction, the above two alignment procedures are not feasible.
3. The use of a multiple mark alignment system involves duplicate steps which we have found will reduce throughput as contrasted to the improved method of this invention.

The present invention resolves the problems encountered as follows:

1. A hybrid mark provides an optimal alignment of the contacts to both the polysilicon layer and the active layer.
2. Alignment performance is better in both the X direction and the Y direction.
3. Unlike a process in which multiple alignment marks (alignment to both an X marks and a Y mark), throughput is not sacrificed.
4. It is possible to assign a weight function if the directional sensitivity of the device is known before the mark design.

The methods presented herein combine both a set of active area marks and an interleaved set of polysilicon marks to form a single composite alignment marking.

Figure 2A:
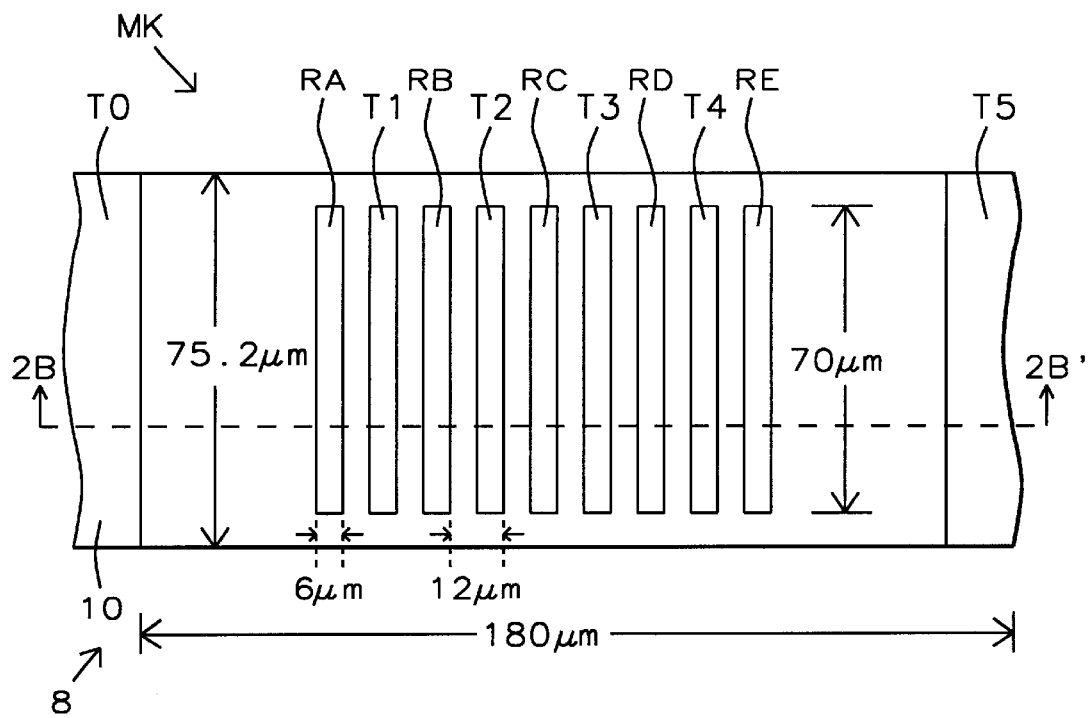
FIG. 2A shows the device of FIGS. 1A after formation of polysilicon ribs thereon to complete an alignment marking.

According to a nine (9) mark Field Image Alignment (FIA) marking scheme, the combined number of marks in an FIA marking still remains at nine (9). The number of marks belonging to the active layer or the polysilicon layer out of the nine (9) marks basically determines the weight of alignment with reference to the active layer or the polysilicon layer respectively. In the case of experimental lots with either an active layer or a polysilicon layer which is not masked beforehand, alignment to one of the previous layers is possible just by changing the marking type parameter setting in the stepper job file. FIG. 2A/FIG. 2B and FIG. 4A/FIG. 4B depict two alternative configurations of a hybrid marking for FIA sensors in Nikon Steppers.

Figure 1A:
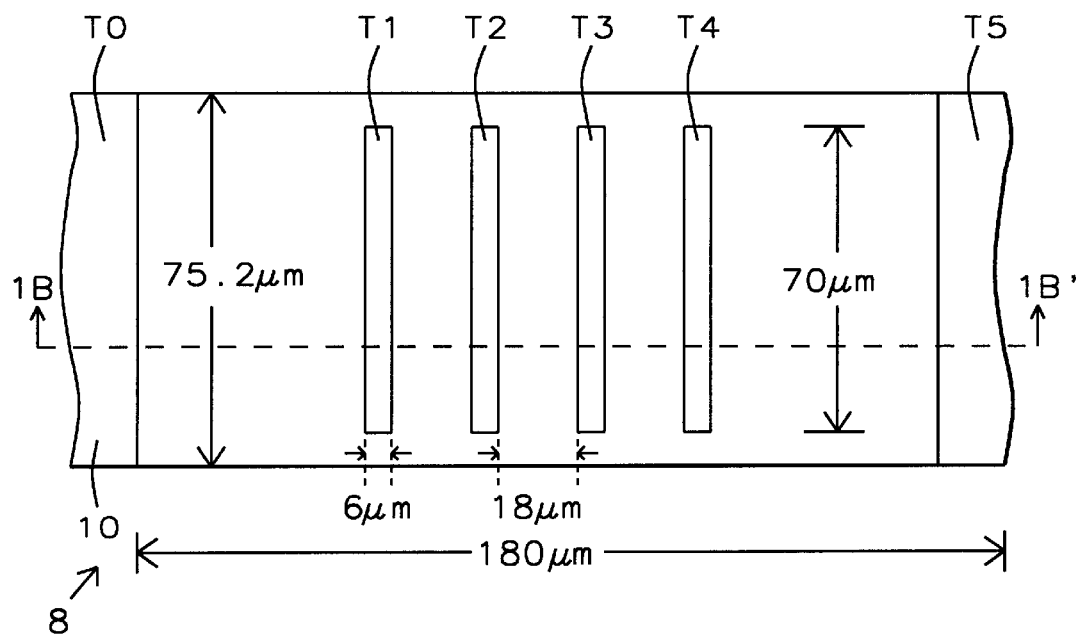
FIG. 1A shows a plan view of a portion of a device with an partially formed alignment marking on a silicon substrate in accordance with this invention in an early stage of manufacture.
Figure 1B:
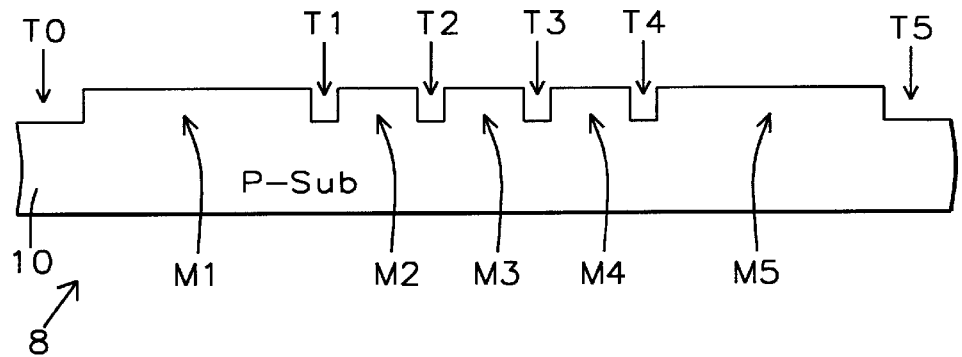
FIG. 1B shows a sectional view of the device of FIG. 1A taken along line 1B–1B'.

FIG. 1A shows a plan view of a portion of a device 8 with a partially formed alignment marking with marks formed on a P-silicon substrate layer 10 in accordance with this invention. The device 8 is in an early stage of manufacture with four (4) shallow, narrow trenches T1, T2, T3, and T4 in the center thereof (oriented vertically on the page) which are portions of a set of alignment marks which will comprise a nine mark FIA marking. FIG. 1B shows a sectional view of the device of FIG. 1A taken along line 1B–1B'.

A set of wide trenches T0 and T5 are formed on the ends for a total of six (6) shallow trenches T0, T1, T2, T3, T4 and T5. Between the trench T0 and trench T1 a mesa M1 is formed. Between the trench T1 and trench T2 a mesa M2 is formed. Between the trenches T3 and trench T4 a mesa M3 is formed. Between the trench T4 and trench T5 a mesa M4 is formed. Between the trench T4 and trench T5 a mesa M5 is formed.

Referring to FIG. 1A, the mesas M1–M5 between the trenches T0 and T5 span one hundred eighty micrometers (180 $\mu$m). The width of the mesas M1–M5 is seventy-five and two tenths micrometers (75.2 $\mu$m). The length of the narrow trenches T1–T4 is seventy micrometers (70 $\mu$m); and the narrow trenches T1, T2, T3, and T4 are six micrometers (6 $\mu$m) wide and trenches T1, T2, T3, and T4 are spaced eighteen micrometers (18 $\mu$m) apart. It is noted that the mesas M1–M5 interconnect at the ends of the trenches T1–T4 which are shorter than the width of the region defined by trenches T1–T4.

Trenches in FIGS. 1A and 1E are made by etching the silicon (P-Sub) substrate layer 10 after forming a mask thereon, as will be well understood by those skilled in the art.

The mask for the substrate layer 10 comprises a coating of a photoresist layer patterned with mask features formed on the substrate layer 10. After etching through that mask, the substrate layer 10 is ready for further processing.

Figure 2B:
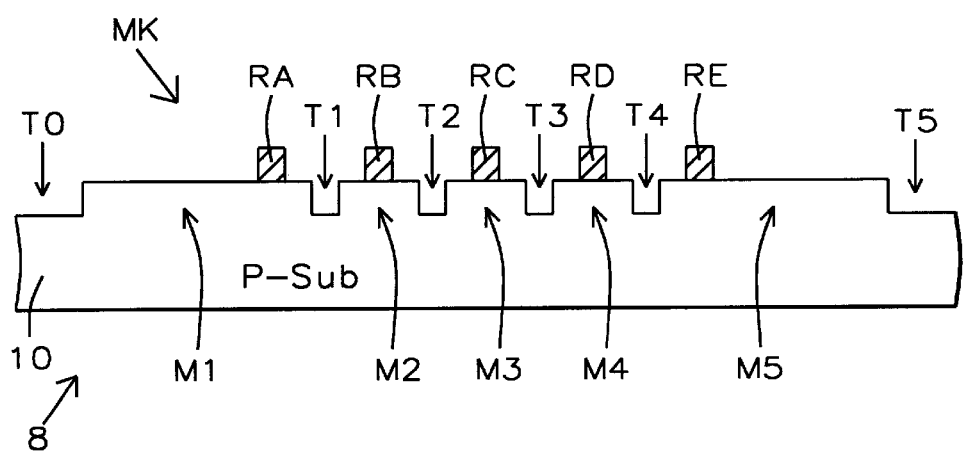
FIG. 2B shows a sectional view of the device of FIG. 2A taken along line 2B–2B'.

FIGS. 2A and 2B show the device 8 of FIGS. 1A and 1B after formation of polysilicon ribs RA, RB, RC, RD and RE, about six micrometers (6 $\mu$m) wide, on the surface of mesas M1, M2, M3, M4 and M5 respectively, parallel to the trenches T1–T4 and spaced about six micrometers (6 $\mu$m) from the adjacent trenches. As shown the ribs RB, RC and RD are located between two of the sets of narrow trenches T1–T4 with the ribs RA and RE being located outside of the outer ones T1 and T4 of the four narrow trenches T1–T4. As seen in FIG. 2A, the spacings between trenches T1–T4 and the ribs RA–RE are equal and the ribs resemble the trenches from that point of view even though the profile seen in FIG. 2B is quite different.

Referring to FIG. 2A and FIG. 2B, the ribs RA, RB, RC, RD and RE are formed by forming a polysilicon layer on the device 8 of FIG. 1A and FIG. 1B and after forming a polysilicon patterning mask over the polysilicon layer to protect the future ribs RA, RB, RC, RD and RE. While that patterning mask is in place, the next step is to etch away the unprotected portions of the polysilicon layer. During polysilicon masking, alignment is made to layer 10 using a regular mark, not the hybrid mark.

As to how the alignment and spacings seen in FIGS. 2A and 2B are achieved, as noted above, the polysilicon patterning mask is aligned to Layer-10 regular mark.- This assures the spacing of Ribs between the trenches T1–T4 of Layer-10, within the tolerance of stepper capability. Typically +/−0.1 $\mu$m.

Figure 3A:
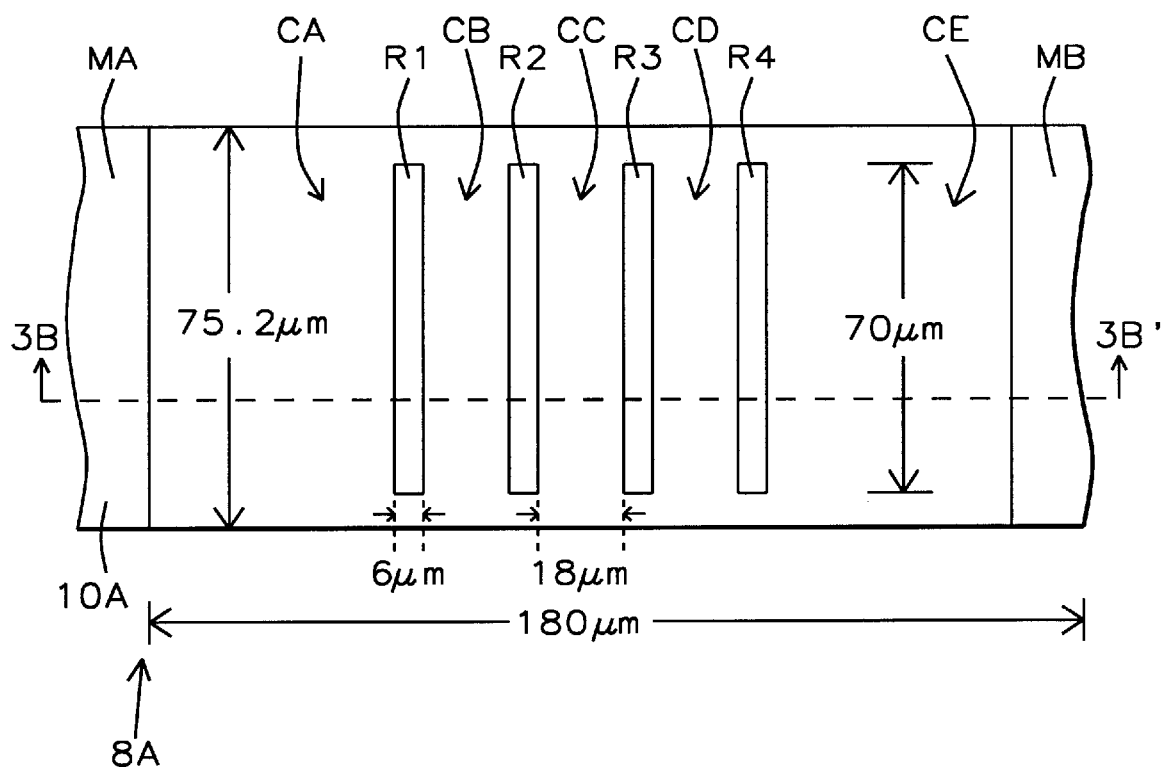
FIG. 3A shows a plan view of a portion of a device with a partially formed alignment marking formed on a P-silicon substrate layer in accordance with embodiment of this invention.
Figure 3B:
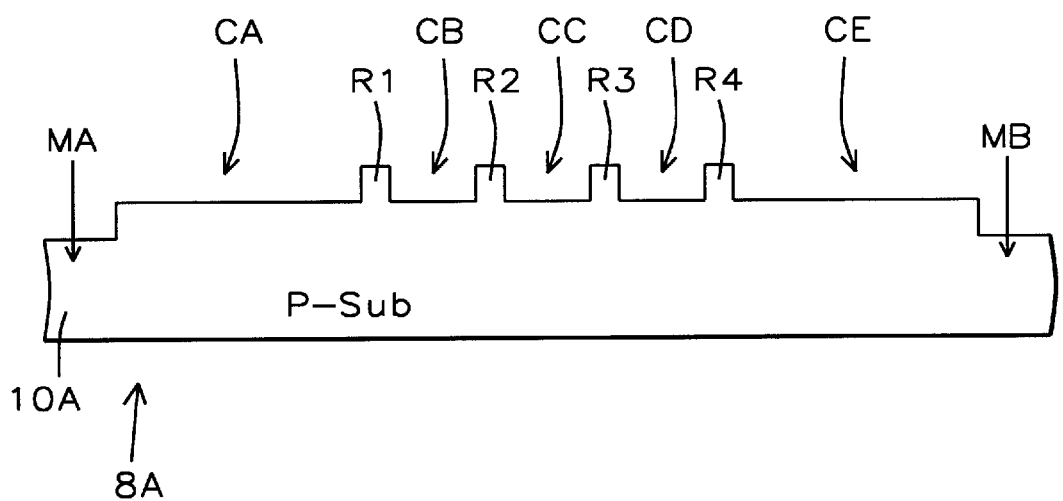
FIG. 3B shows a sectional view of the device of FIG. 3A taken along line 3B–3B'.

FIG. 3A shows a plan view of a portion of a device 8A with a partially formed alignment marking formed on a P-silicon substrate layer 10A in accordance with embodiment of this invention. Device 8A is in an early stage of manufacture with five (5) shallow, interconnected cavities CA, CB, CC, CD and CE between a pair of mesas MA and MB. In FIG. 3A, several ribs R1, R2, R3, R4, and R5 are formed in the center of the spaced defined by cavities CA–CE. FIG. 3B shows a sectional view of the device of FIG. 3A taken along line 3B–3B'.

As described above, although the pattern is complementary to the pattern in FIGS. 1A–1B, the mask for the substrate layer 10A comprises a coating of a photoresist layer patterned with mask features to be formed on the substrate layer 10A. After etching through that mask, the substrate layer 10A is ready for further processing.

Referring to FIGS. 3A and 3B, rib R1 separates cavities CA and CB. Rib R2 separates cavities CB and CC. Rib R3 separates cavities CC and CD. Rib R4 separates cavities CB and CC. Rib R3 separates cavities CD and CE.

Figure 4A:
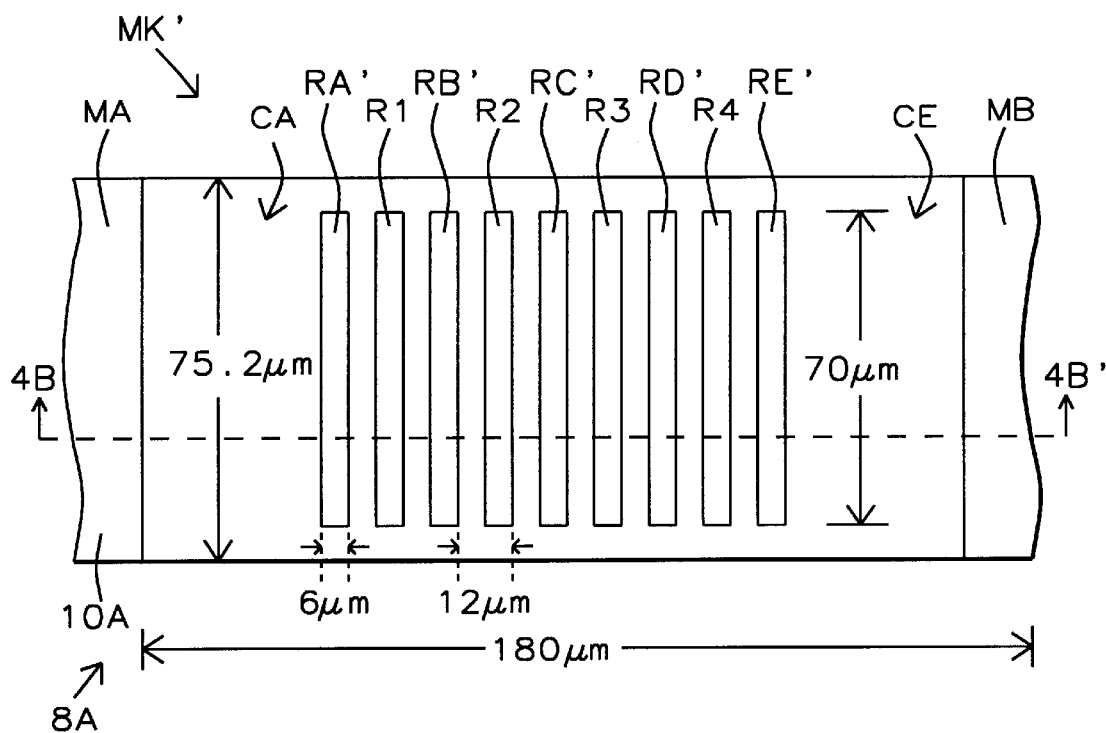
FIG. 4A shows the device of FIGS. 3A after formation of polysilicon ribs thereon to complete another alignment marking.
Figure 4B:
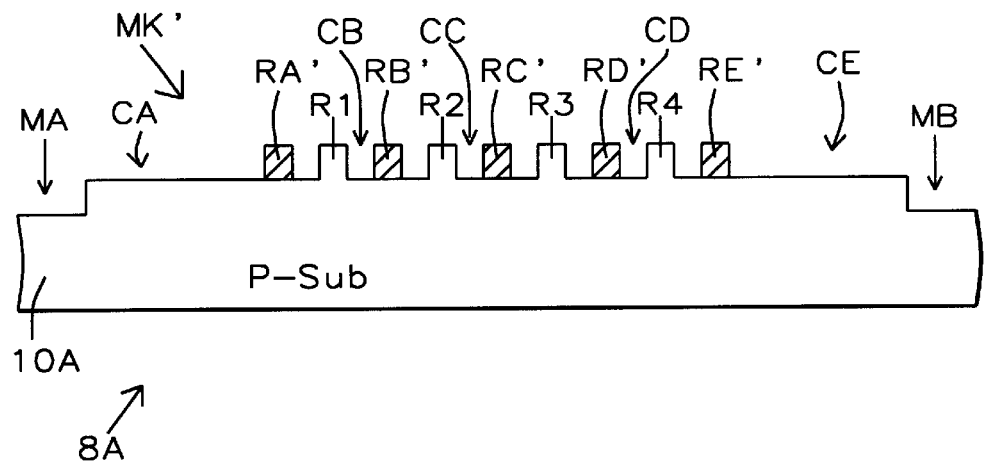
FIG. 4B shows a sectional view of the device of FIG. 4A taken along line 4B–4B'.

As shown in FIG. 3A, the ribs R1–R4 are oriented vertically on the page which are portions of a set of alignment marks which will comprise a nine mark FIA marking as seen in FIG. 4A. Between mesas MA and MB the length of the spaced spanned by the cavities CA to CB and ribs R1–R4 is one hundred eighty micrometers (180 μm). The width of the cavities CA–CE is seventy-five and two tenths micrometers (75.2 μm). It is noted that the cavities CA–CE interconnect at the ends of the ribs R1–R4, which are shorter than the width of the region defined by cavities C1–CE. The narrow ribs R1–R4 are six micrometers (6 μm) wide. The length of the narrow ribs R1–R4 is seventy micrometers (70 μm). The narrow cavities CB, CC, and CD are eighteen micrometers (18 μm) wide so the silicon ribs R1, R2, R3, and R4 are spaced eighteen micrometers (18 μm) apart.

FIGS. 4A and 4B show the device 8A of FIGS. 3A and 3B after formation of polysilicon ribs RA', RB', RC', RD' and RE', about six micrometers (6 μm) wide, on the surface of cavities CA, CB, CC, CD and CE respectively, parallel to the ribs R1–R4 and spaced about six micrometers (6 μm) from the adjacent ribs R1–R4. As shown the ribs RB' RC' and RD' are located between two of the sets of narrow trenches T1–T4 with the ribs RA' and RE' being located outside of the outer ones R1 and R4 of the four narrow ribs R1–R4. As seen in FIG. 4A, the spacings between ribs R1–R4 and the ribs RA'–RE' are equal and the polysilicon ribs RA'–RE' resemble the silicon ribs R1–R4 from that point of view and the profile seen in FIG. 4B shows that the two sets of rib are quite similar.

Referring to FIG. 6, a workpiece M comprising a semiconductor wafer W is shown with device areas DA1 and DA2 thereon and with a set of hybrid alignment marks AM1 and AM2 in accordance with this invention with the marks oriented vertically (parallel to the Y-axis) and horizontally (parallel to the X-axis) respectively. The set of hybrid marks AM1 and AM2 are incorporated in the horizontal (X-mark) and vertical (Y-mark) scribe lanes to provide X and Y alignment coordinates respectively. Typically, marks such as marks AM1 and AM2 can be placed anywhere within a field. During stepper alignment, X and Y marks from about eight (8) fields across the wafer are scanned to calculate alignment parameters such as wafer translation, wafer rotation, wafer scaling, etc. The stepper compensates for these parameters, during the exposure.

FIG. 5 shows a sectional view of a larger portion of the device 8B of FIG. 4B including the adjacent structure, laterally of the marking MK' after coating of the device with dielectric insulator layer IN. At the contact hole CH1, a gate oxide layer GOX formed on mesa and is shown lying below a metallization layer ME1 on the left. Metallization ME1 has a width of 0.35 micrometers (0.35 μm).

On the right of FIG. 5, a Field Effect Transistor device FET is shown on a MFET mesa. Device FET includes a gate oxide layer GOX and gate electrode G formed of the polysilicon layer from which the ribs RA'–RE' have been formed. Atop the gate electrode G is a metallization layer ME2 formed of metal or silicide. Another rib R0 is shown for another portion of the device. A mesa MA is shown between the rib RA' and the mesa on which the contact metallization ME1 is formed. Ribs R0, R1–R4 and the mesas MA, MB and MFET are formed of the active region of P-silicon substrate layer 10B. Contact hole CH1 is formed over metallization layer ME1.

Referring to FIG. 5, the FET is formed on a mesa MFET. The contact hole CH shown in the dielectric insulator layer IN is formed after contact mask and etch steps. The dielectric insulator layer IN is nearly flat after a Chemical Mechanical Polishing (CMP) Step. A contact layer mask, is aligned to the hybrid mark formed by the ribs R1, R2, R3, R4 and RA', RB', RC', RD', RE'. The device 8B is covered by a nearly flat dielectric insulation layer IN. Contact hole CH2 is formed over metallization layer ME2.

It will be understood by those skilled in the art that the composite alignment markings formed as described above can be used in aligning layers above the layers described above using the composite alignment markings for that purpose.

While this invention has been described in terms of the above specific embodiment(s), those skilled in the art will recognize that the invention can be practiced with modifications within the spirit and scope of the appended claims, i.e. that changes can be made in form and detail, without departing from the spirit and scope of the invention. Accordingly all such changes come within the purview of the present invention and the invention encompasses the subject matter of the claims which follow.

Having thus described the invention, what is claimed as new and desirable, to be secured by Letters Patent is as follows:

1. A method of forming hybrid alignment markings with a plurality of parallel marks on an initial layer on which a multilayer structure is formed comprising:

forming initial marks in said initial layer by modifying the profile of said initial layer producing an initial layer surface of said initial layer with initial marks, forming on said initial layer surface a second layer with a set of interleaved marks to form a single composite alignment marking composed of said initial marks and said interleaved marks.

2. A method in accordance with claim 1 wherein said hybrid alignment markings is formed by the steps comprising:

(a) forming integral alignment marks in a said initial layer from the material of said lower layer, (b) forming alignment ribs of said second material a surface of said initial layer interleaved with the integral alignment marks.

3. A method in accordance with claim 1 wherein said hybrid alignment markings is formed by the steps comprising:

(a) forming shallow steps with shallow trenches with low mesas in initial material, (b) forming low ribs of said second material on the low mesas adjacent interleaved with the shallow trenches.

4. A method in accordance with claim 1 wherein said hybrid alignment markings is formed by the steps comprising:

(a) forming shallow cavities with low ribs in said initial material forming exposed low cavity surfaces of said initial material, and (b) forming low ribs of said second material in said shallow cavities on said exposed low cavity surfaces of the initial material.

5. A method of forming hybrid alignment markings with a plurality of parallel marks on an active area of a silicon layer on which a multilayer structure is formed comprising:

forming initial marks in said active area by modifying the profile of said active area producing an active area surface of said active area with initial marks, forming on said active area surface a set of interleaved marks from a second, polysilicon layer to form a single composite alignment marking composed of said initial marks and said interleaved marks.

6. A method in accordance with claim 5 wherein said hybrid alignment markings is formed by the steps comprising:

(a) forming integral alignment marks in said active area of said silicon layer, (b) forming alignment ribs of said second, polysilicon layer on a surface of said active area interleaved with the integral alignment marks.

7. A method in accordance with claim 5 wherein said hybrid alignment markings is formed by the steps comprising:

(a) forming shallow steps with shallow trenches with low mesas in said silicon layer, (b) forming low ribs of said second, polysilicon layer on the low mesas adjacent interleaved with the shallow trenches.

8. A method in accordance with claim 1 wherein said hybrid alignment markings is formed by the steps comprising:

(a) forming shallow cavities with low ribs in said silicon layer forming exposed low cavity surfaces of said silicon layer, and (b) forming low ribs of said second, polysilicon layer in said shallow cavities on said exposed low cavity surfaces of said silicon layer.

9. A device with a set of hybrid alignment markings with a plurality of parallel marks on an initial layer on which a multilayer structure is formed comprising:

initial marks formed in said initial layer providing a profile of said initial layer in the surface of said initial layer, a second layer formed on the surface of said initial layer with a set of interleaved marks forming a single composite alignment marking composed of said initial marks and said interleaved marks.

10. A device with a set of hybrid alignment markings in accordance with claim 9 wherein said hybrid alignment markings comprising:

(a) forming integral alignment marks in a said initial layer from the material of said lower layer, (b) forming alignment ribs of said second material a surface of said initial layer interleaved with the integral alignment marks.

11. A device with a set of hybrid markings in accordance with claim 9 wherein said hybrid alignment markings comprising:

(a) shallow steps with shallow trenches with low mesas in initial material, (b) low ribs of said second material on the low mesas adjacent interleaved with the shallow trenches.

12. A device with a set of hybrid markings in accordance with claim 9 wherein said hybrid alignment markings comprising:

(a) shallow cavities with low ribs in said initial material forming exposed low cavity surfaces of said initial material, and (b) low ribs of said second material in said shallow cavities on said exposed low cavity surfaces of the initial material.

13. A device with a set of hybrid markings of forming hybrid alignment markings with a plurality of parallel marks on an active area of a silicon layer on which a multilayer structure is formed comprising:

initial marks in said active area modifying the profile of said active area, and a set of interleaved marks formed on said active area surface from a second, polysilicon layer forming a single composite alignment marking composed of said initial marks and said interleaved marks.

14. A device with a set of hybrid markings in accordance with claim 13 wherein said hybrid alignment markings comprise:

(a) integral alignment marks formed in said active area of said silicon layer, (b) alignment ribs formed of said second, polysilicon layer on a surface of said active area interleaved with the integral alignment marks.

15. A device with a set of hybrid markings in accordance with claim 13 wherein said hybrid alignment markings comprise:

(a) shallow steps formed with shallow trenches with low mesas in said silicon layer, (b) low ribs formed of said second, polysilicon layer on the low mesas adjacent interleaved with the shallow trenches.

16. A device with a set of hybrid markings in accordance with claim 1 wherein said hybrid alignment markings comprise:

(a) shallow cavities with low ribs in said silicon layer forming exposed low cavity surfaces of said silicon layer, and (b) low ribs formed of said second, polysilicon layer in said shallow cavities on said exposed low cavity surfaces of said silicon layer.

* * * * *